(12) United States Patent
Schwarzberger et al.

(10) Patent No.: US 11,467,188 B2
(45) Date of Patent: Oct. 11, 2022

(54) CURRENT SENSOR FOR IMPROVED FUNCTIONAL SAFETY

(71) Applicant: Infineon Technologies AG, Neubiberg (DE)

(72) Inventors: Guenter Schwarzberger, Reitmehring (DE); Sebastian Maerz, Neubiberg (DE); Wolfgang Raberg, Sauerlach (DE)

(73) Assignee: Infineon Technologies AG

( * ) Notice: Subject to any disclaimer, the term of this patent is extended or adjusted under 35 U.S.C. 154(b) by 203 days.

(21) Appl. No.: 16/800,042

(22) Filed: Feb. 25, 2020

(65) Prior Publication Data

US 2021/0263079 A1 Aug. 26, 2021

(51) Int. Cl.
*G01R 15/20* (2006.01)
*G01R 19/165* (2006.01)

(52) U.S. Cl.
CPC ..... *G01R 15/207* (2013.01); *G01R 19/16571* (2013.01)

(58) Field of Classification Search
CPC .................. G01R 15/207; G01R 19/16571
See application file for complete search history.

(56) References Cited

U.S. PATENT DOCUMENTS

| 10,281,497 | B2* | 5/2019 | Shimizu | G01R 15/20 |
| 11,163,007 | B2* | 11/2021 | Song | H01M 10/48 |
| 2002/0196014 | A1* | 12/2002 | Iwase | G01D 11/245 |
| | | | | 324/207.2 |

OTHER PUBLICATIONS

Isabellenhütte Heusler GmbH & Co. K, "High Precision Measurement". ISAscale, Issue IVT-MOD, Dec. 11, 2012, Version 0.7, [Online] URL: <https://www.isabellenhuette.de/fileadmin/Daten/Praezisionsmesstechnik/IVT_Modular_datasheet_1.20.pdf>.
Melexis Microelectronic Integrated Systems, "A Novel Contact-less Current Sensor for HEV/EV and Renewable Energy Applications". Melexis "Hall" Presentation, ROR-MLX.

\* cited by examiner

*Primary Examiner* — Feba Pothen
(74) *Attorney, Agent, or Firm* — Design IP (57) ABSTRACT

A current sensor arrangement includes a first conductor configured to conduct a first portion of a primary current in a current flow direction; a second conductor configured to conduct a second portion of the primary current in the current flow direction; and a magnetic sensor. The first and second conductor are coupled in parallel. The first current produces a first magnetic field as it flows through the first conductor and the second current produces a second magnetic field as it flows through the second conductor. The first conductor and the second conductor are separated from each other in a first direction that is orthogonal to the current flow direction, thereby defining a gap. The magnetic sensor is arranged in the gap such that the first conductor is arranged over a first portion of the magnetic sensor and the second conductor is arranged under a second portion of the magnetic sensor.

29 Claims, 3 Drawing Sheets

CURRENT SENSOR FOR IMPROVED FUNCTIONAL SAFETY

FIELD

The present disclosure relates generally to a current sensor device and to methods for current sensing, and, more particularly, to a diverse current sensor device and to methods for diverse current sensing.

BACKGROUND

There are many application for a current sensor. As one example, the current sensor is an integral part of a battery system of an electric vehicle. It also plays an important role in the board net architecture of conventional vehicles. New applications, like automated driving, increase the requirements on current sensors concerning functional safety, which includes redundant or diverse current sensing and the ability to detect faulty current sensors.

In electric vehicles there are two main types of current sensors used, shunt based (i.e., resistive based) and Hall-effect based (magnetic-based). In order to improve the functional safety rating of a current sensor, two diverse measurement principles like resistive-based and magnetic-based sensing could be combined. However, combining two diverse sensors may lead to bulky and expensive solutions.

Therefore, a current sensing device that uses a diverse current measurement principle without the above-noted disadvantages may be desirable.

SUMMARY

According to one or more embodiments, a current sensor arrangement includes a conductor configured to conduct a primary current, the conductor including a first end, a second end oppositely arranged with respect to the first end, and a slit that extends partially between the first end and the second end in a current flow direction. The slit divides the conductor into a first conductor portion and a second conductor portion both conjoined at the first end and the second end of the conductor. The primary current flows in the current flow direction from the first end to the second end. The primary current is divided into a first current that produces a first magnetic field as it flows through the first conductor portion in the current flow direction and a second current that produces a second magnetic field as it flows through the second conductor portion in the current flow direction. The first conductor portion and the second conductor portion are separated from each other in a first direction that is orthogonal to the current flow direction, thereby defining a gap. The current sensor arrangement further includes a magnetic sensor arranged in the gap such that the first conductor portion is arranged over a first portion of the magnetic sensor and the second conductor portion is arranged under a second portion of the magnetic sensor.

According to one or more embodiments, a method of manufacturing a current sensor arrangement includes providing a conductor that is configured to conduct a primary current, the conductor including a first end and a second end oppositely arranged with respect to the first end with respect to a current flow direction of the primary current; forming a current impeding structure across the conductor in a bisecting manner in a first direction that is orthogonal to the current flow direction; forming a slit in the conductor that extends partially between the first end and the second end in the current flow direction, where the slit extends through the current impeding structure in the current flow direction and through the conductor in a second direction that is orthogonal to the current flow direction, where the slit divides the conductor into a first conductor portion and a second conductor portion both conjoined at the first end and the second end of the conductor; deforming the first conductor portion and the second conductor portion in opposite directions with respect to second direction, thereby defining a gap; and inserting magnetic sensor through the gap such that the first conductor portion is arranged over a first portion of the magnetic sensor and the second conductor portion is arranged under a second portion of the magnetic sensor.

According to one or more embodiments, a current sensor arrangement includes a first conductor configured to conduct a first portion of a primary current along a first current path in a current flow direction; a second conductor configured to conduct a second portion of the primary current along a second current path in the current flow direction, where the first conductor and the second conductor are coupled in parallel. The first current produces a first magnetic field as it flows through the first conductor and the second current produces a second magnetic field as it flows through the second conductor. The first conductor and the second conductor are separated from each other in a first direction that is orthogonal to the current flow direction, thereby defining a gap. The current sensor arrangement further includes a magnetic sensor arranged in the gap such that the first conductor is arranged over a first portion of the magnetic sensor and the second conductor is arranged under a second portion of the magnetic sensor.

BRIEF DESCRIPTION OF THE DRAWINGS

Embodiments are described herein making reference to the appended drawings.

DETAILED DESCRIPTION

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

Directional terminology, such as "top", "bottom", "above", "below", "front", "back", "behind", "leading", "trailing", "over", "under", etc., may be used with reference to the orientation of the figures and/or elements being described. Because the embodiments can be positioned in a number of different orientations, the directional terminology is used for purposes of illustration and is in no way limiting. In some instances, directional terminology may be exchanged with equivalent directional terminology based on the orientation of an embodiment so long as the general directional relationships between elements, and the general purpose thereof, is maintained.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

Embodiments relate to sensors and sensor systems, and to current sensors and current sensor systems. In general, a sensor may refer to a component which converts a physical quantity to be measured to an electric signal, for example, a current signal or a voltage signal. The physical quantity may for example comprise a magnetic field, an electric field, a pressure, a force, a current or a voltage, but is not limited thereto. It will be appreciated that there are various sensor technique for measuring current, as will be described in the following embodiments.

A magnetic field sensor, for example, includes one or more magnetic field sensor elements that measure one or more characteristics of a magnetic field (e.g., an amount of magnetic field flux density, a field strength, a field angle, a field direction, a field orientation, etc.). The magnetic field may be produced by a magnet, a current-carrying conductor (e.g., a wire), the Earth, or other magnetic field source. Each magnetic field sensor element is configured to generate a sensor signal (e.g., a voltage signal) in response to one or more magnetic fields impinging on the sensor element. Thus, a sensor signal is indicative of the magnitude and/or the orientation of the magnetic field impinging on the sensor element.

Magnetic sensors include magnetoresistive sensors and Hall-effect sensors (Hall sensors), for example. Magnetoresistance is a property of a material to change the value of its electrical resistance when an external magnetic field is applied to it. Some examples of magnetoresistive effects are Giant Magneto-Resistance (GMR), which is a quantum mechanical magnetoresistance effect observed in thin-film structures composed of alternating ferromagnetic and non-magnetic conductive layers, Tunnel Magneto-Resistance (TMR), which is a magnetoresistive effect that occurs in a magnetic tunnel junction (MTJ), which is a component consisting of two ferromagnets separated by a thin insulator, or Anisotropic Magneto-Resistance (AMR), which is a property of a material in which a dependence of electrical resistance on the angle between the direction of electric current and direction of magnetization is observed. For example, in the case of AMR sensors, a resistance for an AMR sensor element changes according to a square of a sine of an angle of the magnetic field component projected on a sensing axis of the ARM sensor element.

The plurality of different magnetoresistive effects is commonly abbreviated as xMR, wherein the "x" acts as a placeholder for the various magnetoresistive effects. xMR sensors can detect the orientation of an applied magnetic field by measuring sine and cosine angle components with monolithically integrated magnetoresistive sensor elements.

A magnetic field component may be, for example, an x-magnetic field component (Bx), a y-magnetic field component (By), or a z-magnetic field component (Bz), where the Bx and By field components are in-plane to the chip, and Bz is out-of-plane to the chip in the examples provided.

Magnetoresistive sensor elements of such xMR sensors typically include a plurality of layers, of which at least one layer is a reference layer with a reference magnetization (i.e., a reference direction). The reference magnetization provides a sensing direction corresponding to a sensing axis of the xMR sensor. Accordingly, if a magnetic field component points exactly in the same direction as the reference direction, a resistance of the xMR sensor element is at a maximum, and, if a magnetic field component points exactly in the opposite direction as the reference direction, the resistance of the xMR sensor element is at a minimum. In some applications, an xMR sensor includes a plurality of magnetoresistive sensor elements, which have the same or different reference magnetizations.

A Hall effect sensor is a transducer that varies its output voltage (Hall voltage) in response to a magnetic field. It is based on the Hall effect which makes use of the Lorentz force. The Lorentz force deflects moving charges in the presence of a magnetic field which is perpendicular to the current flow through the sensor or Hall plate. Thereby, a Hall plate can be a thin piece of semiconductor or metal. The deflection causes a charge separation which causes a Hall electrical field. This electrical field acts on the charge in the opposite direction with regard to the Lorentz Force. Both forces balance each other and create a potential difference perpendicular to the direction of current flow. The potential difference can be measured as a Hall voltage and varies in a linear relationship with the magnetic field for small values. Hall effect sensors can be used for proximity switching, positioning, speed detection, and current sensing applications.

A vertical Hall sensor is a magnetic field sensor constructed with the Hall element perpendicular to the plane of the chip (e.g., extending from a main surface of the chip into the chip body). It senses magnetic fields perpendicular to its defined sensitive edge (top, right, or left, relative to the main surface of the chip). This generally means that a vertical Hall sensor is sensitive to a magnetic field component that extends parallel to their surface and parallel, or in-plane, to the main surface of the chip in which the vertical Hall sensor is integrated. In particular, a vertical Hall sensor may extend from the main surface into the chip. The plane of sensitivity may be referred to herein as a "sensitivity-axis" or "sensing axis" and each sensing axis has a reference direction. For vertical Hall sensor elements, voltage values output by the sensor elements change according to the magnetic field strength in the direction of its sensing axis.

On the other hand, a lateral (planar) Hall sensor is constructed with the Hall element in the same plane as the main surface of the chip. It senses magnetic fields perpendicular to its planar surface. This means they are sensitive to magnetic fields vertical, or out-of-plane, to the main surface of the chip. The plane of sensitivity may be referred to herein as a "sensitivity-axis" or "sensing axis" and each sensing axis has a reference direction. Similar to vertical Hall sensor elements, voltage values output by lateral Hall sensor elements change according to the magnetic field strength in the direction of its sensing axis.

Embodiments may be directed specifically to magnetic sensors that are sensitive to magnetic fields that are parallel to the chip plane for measuring magnetic fields produced by a current. Thus, xMR sensors and vertical Hall sensors may be used because both are sensitive to magnetic fields in the chip plane.

A magnetic field sensor, as provided herein, may be used as a current sensor. For example, the magnetic field sensor can be used as a current sensor if it is coupled to a magnetic field generated by some current to be measured which flows through some primary conductor. For example, contactless current measurement can be accomplished by using the magnetic field sensor to sense the magnetic field caused by a current passing through a conductor. The magnetic field caused by the current depends on the magnitude of the current. For example, for a long straight wire carrying a current i, the magnitude of the resulting magnetic field H at a distance d from the wire is directly proportional to the current i. In accordance to the Biot-Savart law, the magnitude of the magnetic field H equals $H=i/(2\pi d)$ if the wire is very long (theoretically infinitely long) as compared to the distance d.

According to one or more embodiments, a plurality of magnetic field sensors and a sensor circuitry may be both accommodated (i.e., integrated) in the same chip. The sensor circuit may be referred to as a signal processing circuit and/or a signal conditioning circuit that receives one or more signals (i.e., sensor signals) from one or more magnetic field sensor elements in the form of raw measurement data and derives, from the sensor signal, a measurement signal that represents the magnetic field.

In some cases, a measurement signal may be differential measurement signal that is derived from sensor signals generated by two sensor elements having a same sensing axis (e.g., two sensor elements sensitive to the same magnetic field component) using differential calculus. A differential measurement signal provides robustness to homogenous external stray magnetic fields.

Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a sensor output suitable for processing after conditioning.

Thus, the sensor circuit may include an analog-to-digital converter (ADC) that converts the analog signal from the one or more sensor elements to a digital signal. The sensor circuit may also include a digital signal processor (DSP) that performs some processing on the digital signal, to be discussed below. Therefore, a chip, which may also be referred to as an integrated circuit (IC), may include a circuit that conditions and amplifies the small signal of one or more magnetic field sensor elements via signal processing and/or conditioning.

A sensor device, as used herein, may refer to a device which includes a sensor and sensor circuit as described above. A sensor device may be integrated on a single semiconductor die (e.g., silicon die or chip). Thus, the sensor and the sensor circuit are disposed on the same semiconductor die.

Embodiments combine a current sense resistor, such as a shunt resistor, with a magnetic current sensor by inserting the magnetic current sensor into the current sense resistor in a dedicated way. In particular, a shape of the current sense resistor is modified to enable differential sensing of the magnetic field caused by the current flow through the current sense resistor. This decreases susceptibility to external magnetic fields. Since the magnetic current sensor is integrated into the current sense resistor there is no additional space needed and therefore the overall size of the diverse sensor system is reduced. Furthermore, by combining two diverse measurement principles like resistive and magnetic based sensing, the functional safety rating is improved.

Figure 1A:
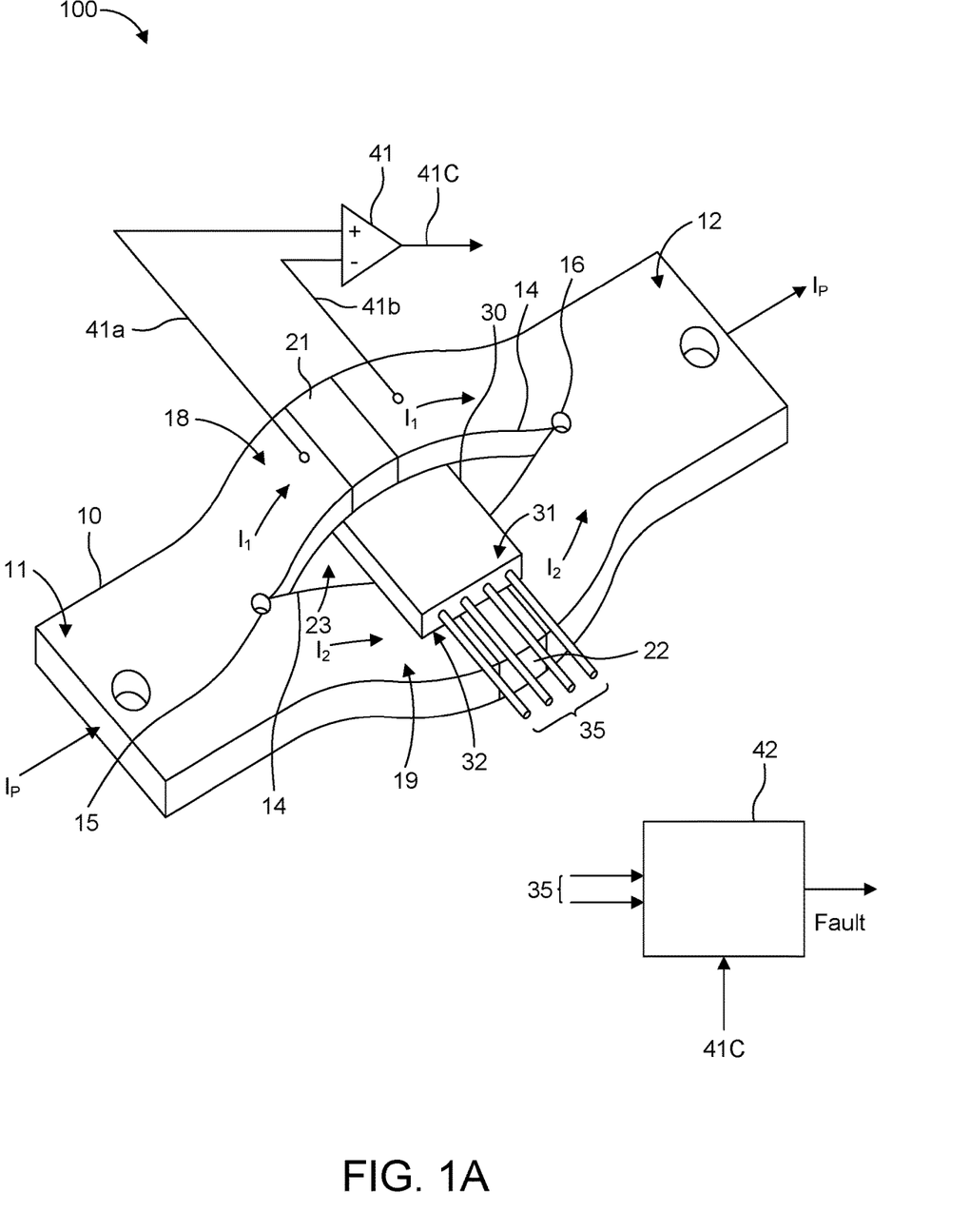
FIG. 1A is a perspective view of a diverse current sensor according to one or more embodiments.
Figure 1B:
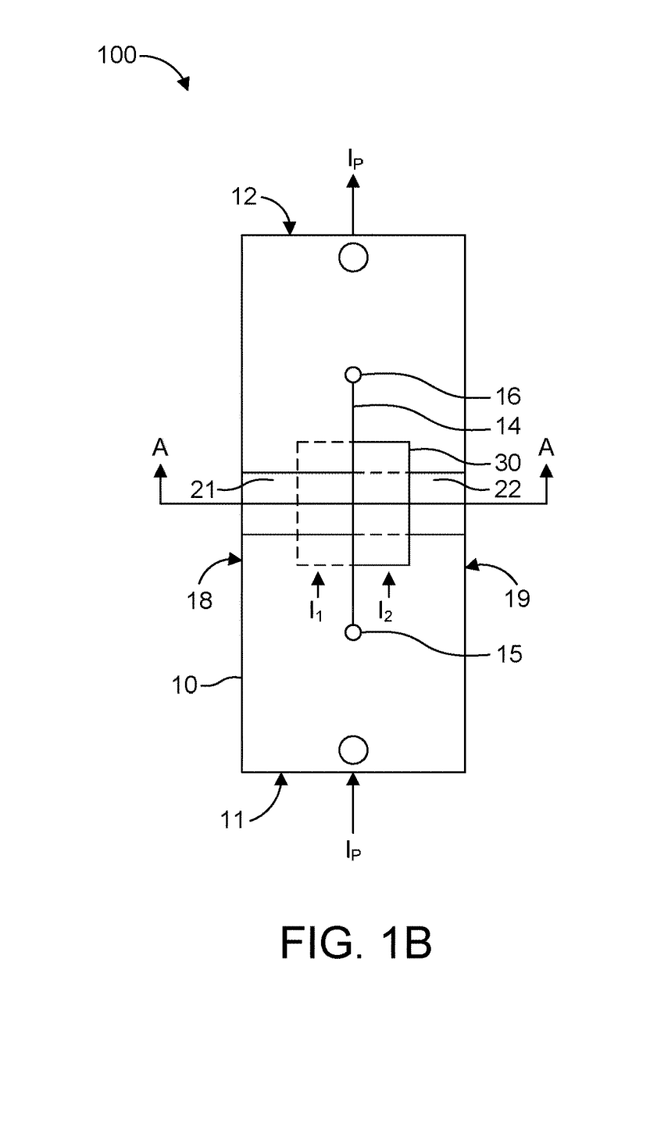
FIG. 1B is a plan view of the diverse current sensor shown in FIG. 1A.
Figure 1C:
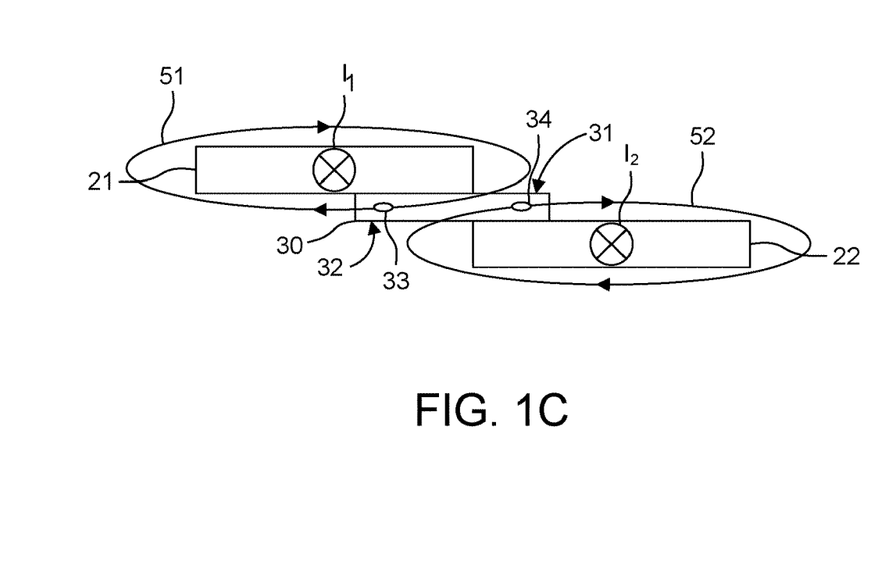
FIG. 1C is a cross-sectional view of the diverse current sensor taken along cut line A-A shown in FIG. 1B.

FIG. 1A is a perspective view of a diverse current sensor 100 according to one or more embodiments. FIG. 1B is a plan view of the diverse current sensor 100 shown in FIG. 1A. FIG. 1C is a cross-sectional view of the diverse current sensor 100 taken along cut line A-A shown in FIG. 1B.

The diverse current sensor 100 includes a conductor 10 that includes a first conjoined end 11 and a second conjoined end 12. The conductor 10 may be, for example, a current rail or busbar made of copper or other electrically conductive material. The conductor 10 is configured to conduct a primary current Ip from the first conjoined end 11 to the second conjoined end 12, or vice versa. For example, the first conjoined end 11 may be an input lead configured to be connected to a power supply, such as a battery. The second conjoined end 12 may be an output lead that is configured to be connected to a load, such as a motor phase.

The conductor 10 further includes a slit 14 interposed between the two conjoined ends 11 and 12. In particular, the slit 14 is a cut that extends entirely through a thickness of the conductor and also extends along the current flow direction in a lengthwise direction of the conductor 10. The conductor 10 may further include a first crack stop 15 and a second crack stop 16 located at opposing ends of the slit 14. The first crack stop 15 and the second crack stop 16 prevent the slit 14 from enlarging beyond the boundaries defined by the first and second crack stops 15, 16.

The slit 14 separates the conductor 10 into a first conductor portion 18 (i.e., a first current path) and a second conductor portion 19 (i.e., a second current path) that are conjoined at both of the two conjoined ends 11 and 12. Thus, the first conductor portion 18 and the second conductor portion 19 represent two parallel conducting paths having a shared current source (i.e., a same current input) and a shared current sink (i.e., a same current output). Both the first conductor portion 18 and a second conductor portion 19 extend along the current flow direction between the two conjoined ends 11 and 12. Both the first conductor portion 18 and a second conductor portion 19 are configured to conduct or carry equal or substantially equal portions of the primary current Ip. Thus, the first conductor portion 18 conducts a first current I1 derived from the primary current Ip and the second conductor portion 18 conducts a second current I2 derived from the same primary current Ip.

The conductor 10 further includes two current impeding structures, each of which induce a voltage difference across its body as a current flows therethrough. For example, a first shunt resistor 21 is arranged in the first conductor portion 18 in a bisecting manner to the current flow (i.e., orthogonal to the first current path) and a second shunt resistor 22 is arranged in the second conductor portion 19 in a bisecting manner to the current flow (i.e., orthogonal to the second current path). The first and the second shunt resistors 21 and 22 may be made nickel, chromium, or alloys thereof, but is not limited thereto. For example, the first and the second shunt resistors 21 and 22 may be made manganin that has a composition of copper, manganese, and nickel.

The conductor 10 may be bent or deformed such that the first conductor portion 18 and the second conductor portion 19 separate from each other at the slit 14 in two opposing directions. The two opposing directions may be regarded as parallel to the thickness direction of the conductor 10, orthogonal to the length direction of the conductor 10, or orthogonal to the direction of the current flow between the first end 11 and the second end 12. For example, the first conductor portion 18 may be bent upward (or downward) and the second conductor portion 19 may be bent downward (or upward) such that a gap 23 is formed between the first conductor portion 18 and the second conductor portion 19.

The diverse current sensor 100 further includes a differential magnetic sensor 30 that has a first main surface 31 (e.g., a first chip surface) and a second main surface 32 (e.g., a second chip surface) arranged opposite to the first main surface 31 in a direction parallel to the thickness direction of the conductor 10. The differential magnetic sensor 30 is inserted into the gap 23 formed between the first conductor portion 18 and the second conductor portion 19. In this way, the first conductor portion 18 overlaps with a portion of the first main surface 31 and the second conductor portion 19 overlaps with a portion of the second main surface 32. Thus, the differential magnetic sensor 30 resides below the first current path I1 and above the second current path I2, which is made more apparent in FIG. 1C.

The differential magnetic sensor 30 includes a first sensing element 33 and a second sensing element 34 arranged in a differential configuration. In particular, the first sensing element 33 and the second sensing element 34 are sensitive to the same magnetic field component of the magnetic fields generated by the first current I1 flowing through the first conductor portion 18 and the second current I2 flowing through the second conductor portion 19, respectively. In a configuration in which the two current impeding structures are provided, the first sensing element 33 and the second sensing element 34 are sensitive to the same magnetic field component of the magnetic fields generated by the first current I1 flowing through the first conductor portion 18 and the first shunt resistor 21 and the second current I2 flowing through the second conductor portion 19 and the second shunt resistor 22, respectively. For example, their sensing axis or reference direction may be aligned parallel or antiparallel with each other to measure the same magnetic field component that is in the chip plane (i.e., same plane as the main surfaces 31 and 32). Both sensing elements 33 and 34 generate sensor signals in response to measuring the magnetic field component of a magnetic field impinging thereon. The sensor signals are representative of a magnetic field strength of the magnetic field component.

Additionally, while the first sensing element 33 may be a single sensor element it may also be a group of sensor elements that are arranged in a Wheatstone-bridge configuration, with each sensor element being sensitive to the same magnetic field component. The Wheatstone-bridge configuration may output a single sensor signal as a first sensor signal.

Similarly, while the second sensing element 34 may be a single sensor element it may also be a group of individual sensor elements that are arranged in a Wheatstone-bridge configuration, with each sensor element being sensitive to the same magnetic field component. The Wheatstone-bridge configuration may output a single sensor signal as a second sensor signal.

The differential magnetic sensor 30 further includes lead wires 35 that input or output various signals to the differential magnetic sensor 30. For example, the lead wires 35 may output the sensor signals generated by the sensing elements 33 and 34. In addition, the lead wires 35 may provide a first supply potential (e.g., a source voltage) and a second supply potential (e.g., ground potential) to the sensing elements 33 and 34.

The diverse current sensor 100 may further include measurement circuity that includes a differential operational amplifier 41 and a processing circuit 42.

The differential operational amplifier 41 includes two inputs 41a and 41b that are connected across one of the shunt resistors 21 or 22. In this example, the two inputs 41a and 41b that are connected to two locations of the first conductor portion 18 across shunt resistor 21 in order to measure a difference in potential across the shunt resistor 21. The differential operational amplifier 41 generates an output signal (e.g., a voltage) representative of the difference in potential across the shunt resistor 21 and outputs the output signal from its output 41c. It will be appreciated that another type of circuit component or suitable circuit capable of tapping the two potentials across the shunt resistor 21 and generating an output signal representative of the difference in potential (i.e., representative of the voltage drop) may also be used.

The processing circuit 42 may be analog circuitry, a digital circuitry, such as a microprocessor or digital signal processor, or a combination of analog circuitry and digital circuitry. The processing circuit 42 receives the analog measurement signals from the differential magnetic sensor 30 and the differential operational amplifier 41 and performs processing and analysis thereon. These analog measurement signals include the sensor signals generated by the sensing elements 33 and 34 and the output signal generated by the differential operational amplifier 41. The processing circuit 42 is configured to calculate the first current I1 based on the output signal and by applying Ohm's Law, with the resistance across the first shunt resistor 21 being known and stored in memory. The processing circuit 42 is further configured to calculate the first current I1 based on the sensor signals.

In particular, current I1 flowing through the first shunt resistor 21 creates a first magnetic field 51 that is parallel to the conductor surface of the first conductor portion 18 and perpendicular to the current flow direction of the current I1. Similarly, current I2 flowing through the second shunt resistor 22 creates a second magnetic field 52 that is parallel to the conductor surface of the second conductor portion 19 and perpendicular to the current flow direction of the current I2. The differential magnetic sensor 30 uses a measurement principle which is sensitive to magnetic fields in the chip plane, such as those based on vertical Hall-effect sensors or the AMR-effect, the GMR- effect, or the TMR-effect. Thus, these types of magnetic sensors used for the sensing elements 33 and 34 are suited to pick up the above described fields generated by the current lines 18 and 19.

The first sensing element 33 is arranged within the first magnetic field 51 and is positioned such that a lateral or in-plane component of the first magnetic field 51 intersects with the sensing axis of the sensing element 33. As a result, sensing element 33 is arranged to measure the lateral or in-plane component of the first magnetic field 51 and generate a first sensor signal based thereon. In this example, the sensing element 33 is arranged under the first conductor portion 18. In other words, the sensing element 33 is arranged such that the sensing element 33 and the first conductor portion 18 overlap in the thickness direction of the conductor 10 (i.e., in the thickness direction of the first conductor portion 18), which is orthogonal to the current flow of the first current I1.

Similarly, the second sensing element 34 is arranged within the second magnetic field 52 and is positioned such that a lateral or in-plane component of the second magnetic field 52 intersects with the sensing axis of the sensing element 34. As a result, sensing element 34 is arranged to measure the lateral or in-plane component of the second magnetic field 52 and generate a second sensor signal based thereon. In this example, the sensing element 34 is arranged above the second conductor portion 19. In other words, the sensing element 34 is arranged such that the sensing element 34 and the second conductor portion 19 overlap in the thickness direction of the conductor 10 (i.e., in the thickness direction of the second conductor portion 19), which is orthogonal to the current flow of the second current I2.

As can be seen in FIG. 1C, by placing the sensor elements 33 and 34 in a differential configuration below the first current path I1 and above the second current path I2, respectively, the sensor elements 33 and 34 receive magnetic fields 51 and 52 that are substantially equal but opposite in direction. The processing circuit 42 may be configured to generate a differential sensor signal based on the first sensor signal and the second sensor signal wherein the differential sensor signal is robust against positioning tolerances and robust against disturbance fields. For example, the processing circuit 42 may calculate an average of the magnitudes (i.e., absolute values) of the first and second sensor signals to derive the differential sensor signal. Alternatively, the processing circuit 42 may subtract one of the sensor signals from the other sensor signal to derive the differential sensor signal. In either case, the calculated value of the differential sensor signal should be substantially equal (i.e., within a predetermined tolerance range) to the value of the output signal generated by the differential operational amplifier 41. If not, an error or fault may exist and this error or fault can be detected by the processing circuit 42 using a comparison operation.

For fault detection, the processing circuit 42 may calculate a difference between the output signal generated by the differential operational amplifier 41 and the differential sensor signal, compare the calculated difference to a predetermined threshold or threshold range, and detect a fault on a condition that the calculated difference exceeds the predetermined threshold or threshold range. If this condition is satisfied, the processing circuit 42 may be configured to generate and output a fault signal indicating that an error or fault occurred in the system. Otherwise, the processing circuit 42 determines that the system is operating normally and a fault signal is not generated.

By using two parallel conducting paths 18 and 19 and placing the sensor elements 33 and 34 in a differential configuration below the first current path I1 and above the second current path I2, respectively, the entire magnetic field sensor setup is robust against positioning tolerances, robust against disturbance fields, and efficient with respect to space consumption. By comparing both sensor readings (magnetics and shunt based) the results can be validated and a malfunction of the sensor can be detected, therefore improving the functional safety rating of the combined sensor versus a single sensor.

Further embodiments may include a temperature sensor used for temperature compensation of the sensor signals, an amplification circuit used to amplify the sensor signals, a circuit for fast current threshold detection (i.e., overcurrent detection), copper busbars used instead of shunts 21 and 22 (with increased temperature dependency), and/or copper busbars used instead of shunts 21 and 22 plus temperature sensors used for temperature compensation of the sensor signals.

For overcurrent detection, the processing circuit 42 may compare values of both the output signal and the differential sensor signal to an overcurrent threshold, and generate and output an overcurrent fault signal on a condition that at least one of the signal values exceed the overcurrent threshold.

Figure 2:
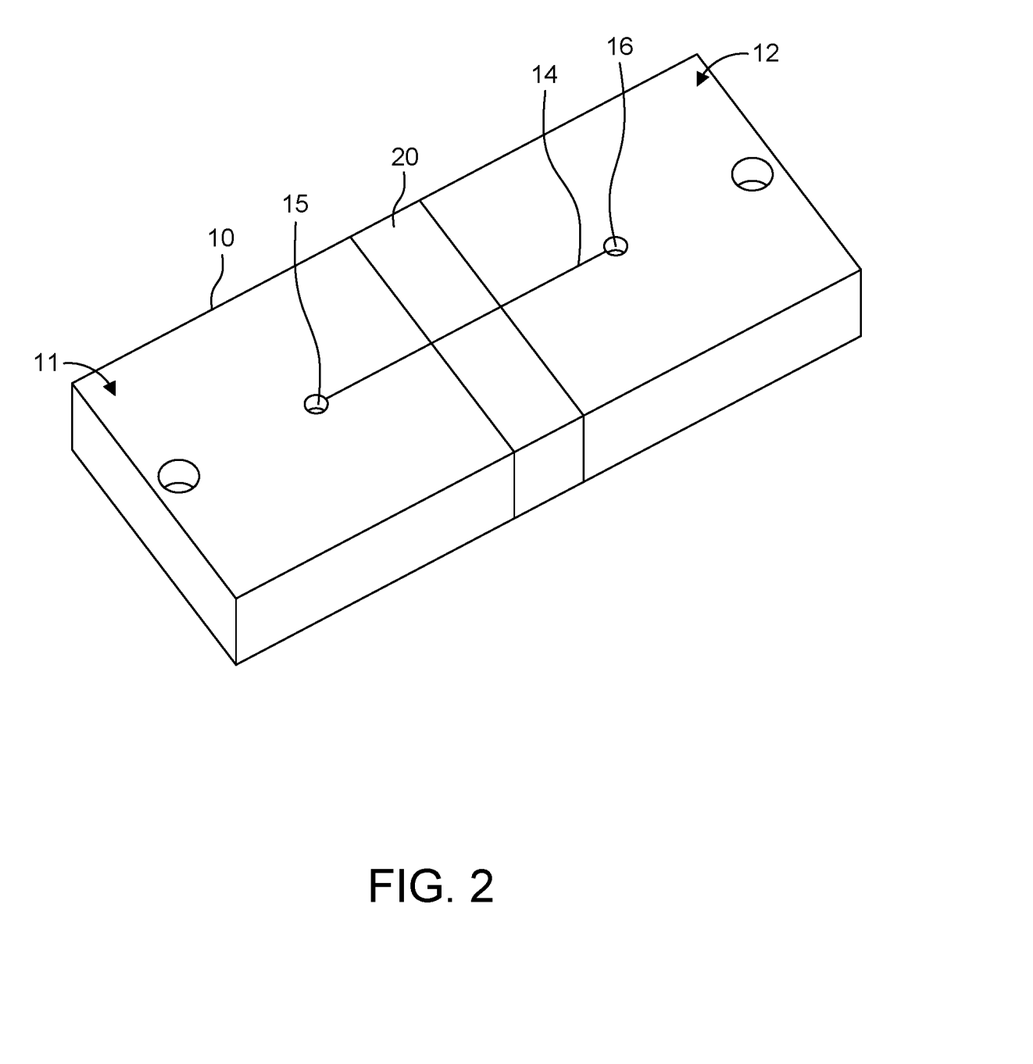
FIG. 2 is a perspective view of a conductor used in the diverse current sensor according to one or more embodiments.

FIG. 2 is a perspective view of the conductor 10 used in the diverse current sensor 100 according to one or more embodiments. In particular, the conductor 10 is shown prior to separating the first conductor portion 18 and the second conductor portion 19. Here, a current impeding structure 20 is formed between the two conjoined ends 11 and 12 of the conductor 10. The current impeding structure 20 bisects the conductor 10 orthogonal to the direction of current flow so that a current passes through the current impeding structure 20. After the current impeding structure 20 is formed, the conductor 10 may be cut to form the slit 14. Crack stops 15 and 16 may also be formed at opposing ends of the slit 14 to prevent the slit 14 from being enlarged beyond the boundaries of the crack stops 15 and 16 during bending to form the first conductor portion 18 and the second conductor portion 19. The two parallel portions of the conductor 10 may then be bent in opposite directions to form the gap 23 shown in FIG. 1A. As a result, the first conductor portion 18 and the second conductor portion 19 are formed with their respective shunt resistors 21 and 22 being portions of the current impeding structure 20 that have been also split apart by the bending or deforming. The differential magnetic sensor 30 may then be inserted into the gap 23 and the measurement circuitry coupled to receive the sensor signals and to measure the voltage drop across one of the shunt resistors 21 or 22 giving a measure of the current flow.

The method of inserting the magnetic-based sensor into the conductor enables space savings and reduction of power losses while still maintaining differential sensing. The differential arrangement of the sensing elements enables a robust differential measurement of the magnetic field using straight conductors with the current flowing in the same direction. Furthermore, the diverse combination of shunt-based and magnetic-based sensing improves the functional safety of the overall device.

It will be further appreciated that two conductor strips, connected in parallel, may be used as the first conductor portion 18 and the second conductor portion 19.

Alternatively, the two conjoined ends 11 and 12 may be separate conductor pieces that may be coupled or bonded together via the shunts 21 and 22. In this case, each conjoined end 11 and 12 includes its respective portion (e.g., half) of the first conductor portion 18 and the second conductor portion 19. Shunt 21 is used to couple the two first conductor portions 18 together and the shunt 22 is used to couple the two second conductor portions 19 together. The two first conductor portions 18 and the two second conductor portions 19 can be similarly formed as described above by first forming a slit 14 partially along the current flow direction in each conjoined end 11 and 12 (i.e., from one side of a conductor portion towards an opposite side of the conductor portion), and then deforming the two conductor portions 18 and 19 of each conjoined end 11 and 12 in opposite directions. Once the two conductor portions 18 and 19 of each conjoined end 11 and 12 are deformed, the two conjoined ends 11 and 12 can be coupled together by shunts 21 and 22 to form the structure illustrated in FIGS. 1A-1C. Here, mechanical fasteners may also be used to couple the parts together.

While various embodiments have been described, it will be apparent to those of ordinary skill in the art that many more embodiments and implementations are possible within the scope of the disclosure. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure. Such hardware, software, and firmware may be implemented within the same device or within separate devices to support the various techniques described in this disclosure.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A current sensor arrangement, comprising:
   a conductor configured to conduct a primary current, the conductor comprising a first end, a second end oppositely arranged with respect to the first end, and a slit that extends partially between the first end and the second end in a current flow direction,
   wherein the slit divides the conductor into a first conductor portion and a second conductor portion both conjoined at the first end and the second end of the conductor,
   wherein the primary current flows in the current flow direction from the first end to the second end,
   wherein the primary current is divided into a first current that produces a first magnetic field as it flows through the first conductor portion in the current flow direction and a second current that produces a second magnetic field as it flows through the second conductor portion in the current flow direction, and
   wherein the first conductor portion and the second conductor portion are separated from each other in a first direction that is orthogonal to the current flow direction, thereby defining a gap;
   a magnetic sensor arranged in the gap such that the first conductor portion is arranged over a first portion of the magnetic sensor and the second conductor portion is arranged under a second portion of the magnetic sensor;
   a first current impeding structure arranged in the first conductor portion, the first current impeding structure bisecting the first conductor portion in a second direction that is orthogonal to the current flow direction; and
   a second current impeding structure arranged in the second conductor portion, the second current impeding structure bisecting the second conductor portion in the second direction that is orthogonal to the current flow direction,
   wherein the first current impeding structure is arranged over the first portion of the magnetic sensor and second current impeding structure is arranged under the second portion of the magnetic sensor.

2. The current sensor arrangement of claim 1, wherein:
the magnetic sensor is configured to generate a first sensor signal based on the first magnetic field impinging the first portion of the magnetic sensor and generate a second sensor signal based on the second magnetic field impinging the second portion of the magnetic sensor.

3. The current sensor arrangement of claim 1, wherein:
the magnetic sensor includes at least one first sensing element arranged in the first portion of the magnetic sensor and within the first magnetic field, the at least one first sensing element configured to generate a first sensor signal based on the first magnetic field impinging thereon, and
the magnetic sensor includes at least one second sensing element arranged in the second portion of the magnetic sensor and within the second magnetic field, the at least one second sensing element configured to generate a second sensor signal based on the second magnetic field impinging thereon.

4. The current sensor arrangement of claim 3, wherein:
each of the at least one first sensing element comprises a first sensing axis and the at least one first sensing element is configured to generate the first sensor signal in response to a magnetic field component of the first magnetic field being projected onto each first sensing axis,
each of the at least one second sensing element comprises a second sensing axis and the at least one second sensing element is configured to generate the second sensor signal in response to a magnetic field component of the second magnetic field being projected onto each second sensing axis, and
each first sensing axis is parallel or antiparallel to each second sensing axis.

5. The current sensor arrangement of claim 3, wherein:
the magnetic sensor comprises a first main surface and a second main surface arranged opposite to the first main surface in the first direction, and
the at least one first sensing element and the at least one second sensing element are sensitive to magnetic field components of the first magnetic field and the second magnetic field that extend parallel to the first main surface and the second main surface and that extend orthogonal to the current flow direction.

6. The current sensor arrangement of claim 3, wherein:
the at least one first sensing element is arranged in the first portion of the magnetic sensor such that the first magnetic field is projected onto the at least one first sensing element in parallel to a conductor surface of the first conductor portion and orthogonal to the current flow direction, and
the at least one second sensing element is arranged in the second portion of the magnetic sensor such that the second magnetic field is projected onto the at least one second sensing element in parallel to a conductor surface of the second conductor portion and orthogonal to the current flow direction.

7. The current sensor arrangement of claim 3, further comprising:
a processing circuit configured to receive the first sensor signal and the second sensor signal and generate a differential sensor signal based on the first sensor signal and the second sensor signal, wherein the differential sensor signal is representative of at least one of the first current and the second current.

8. The current sensor arrangement of claim 7, further comprising:
a measurement circuit configured to measure a voltage drop across a portion of the first conductor portion in the current flow direction or across a portion of the second conductor portion in the current flow direction, wherein the processing circuit is configured to calculate a current value based on the measured voltage drop.

9. The current sensor arrangement of claim 8, wherein the processing circuit is configured to calculate a difference between the current value and a value of the differential sensor signal, compare the calculated difference to a threshold value, and generate a fault signal on a condition that the calculated difference exceeds the threshold value.

10. The current sensor arrangement of claim 8, wherein the processing circuit is configured to compare the current value and a value of the differential sensor signal to an overcurrent threshold, and generate an overcurrent fault signal on a condition that at least one of the current value or the value of the differential sensor signal exceed the overcurrent threshold.

11. The current sensor arrangement of claim 1, wherein the first current impeding structure is a first shunt resistor having a first resistance and the second current impeding structure is a second shunt resistor having a second resistance that is substantially equal to the first resistance such that the first current and the second current are substantially equal.

12. The current sensor arrangement of claim 1, wherein:
the magnetic sensor includes at least one first sensing element arranged in the first portion of the magnetic sensor and within the first magnetic field, the at least one first sensing element configured to generate a first sensor signal based on the first magnetic field impinging thereon, and
the magnetic sensor includes at least one second sensing element arranged in the second portion of the magnetic sensor and within the second magnetic field, the at least one second sensing element configured to generate a second sensor signal based on the second magnetic field impinging thereon.

13. The current sensor arrangement of claim 12, wherein:
the first current impeding structure produces the first magnetic field that is projected onto the at least one first sensing element, and
the second current impeding structure produces the second magnetic field that is projected onto the at least one second sensing element.

14. A current sensor arrangement, comprising:
a conductor configured to conduct a primary current, the conductor comprising a first end, a second end oppositely arranged with respect to the first end, and a slit that extends partially between the first end and the second end in a current flow direction,
wherein the slit divides the conductor into a first conductor portion and a second conductor portion both conjoined at the first end and the second end of the conductor,
wherein the primary current flows in the current flow direction from the first end to the second end,
wherein the primary current is divided into a first current that produces a first magnetic field as it flows through the first conductor portion in the current flow direction and a second current that produces a second magnetic field as it flows through the second conductor portion in the current flow direction, and wherein the first conductor portion and the second conductor portion are separated from each other in a first direction that is orthogonal to the current flow direction, thereby defining a gap;
a magnetic sensor arranged in the gap such that the first conductor portion is arranged over a first portion of the magnetic sensor and the second conductor portion is arranged under a second portion of the magnetic sensor;
a first current impeding structure arranged in the first conductor portion, the first current impeding structure bisecting the first conductor portion in a second direction that is orthogonal to the current flow direction;
a second current impeding structure arranged in the second conductor portion, the second current impeding structure bisecting the second conductor portion in the second direction that is orthogonal to the current flow direction; and
a measurement circuit configured to measure a voltage drop across the first current impeding structure or across the second current impeding structure; and
a processing circuit configured to calculate a current value based on the measured voltage drop.

15. The current sensor arrangement of claim 14, wherein:
the magnetic sensor is configured to generate a first sensor signal based on the first magnetic field impinging the first portion of the magnetic sensor and generate a second sensor signal based on the second magnetic field impinging the second portion of the magnetic sensor, and
the processing circuit is configured to receive the first sensor signal and the second sensor signal and generate a differential sensor signal based on the first sensor signal and the second sensor signal, wherein the differential sensor signal is representative of at least one of the first current and the second current.

16. The current sensor arrangement of claim 15, wherein the processing circuit is configured to calculate a difference between the current value and a value of the differential sensor signal, compare the calculated difference to a threshold value, and generate a fault signal on a condition that the calculated difference exceeds the threshold value.

17. The current sensor arrangement of claim 15, wherein:
the magnetic sensor includes at least one first sensing element arranged in the first portion of the magnetic sensor and within the first magnetic field, the at least one first sensing element configured to generate the first sensor signal based on the first magnetic field impinging thereon, and
the magnetic sensor includes at least one second sensing element arranged in the second portion of the magnetic sensor and within the second magnetic field, the at least one second sensing element configured to generate the second sensor signal based on the second magnetic field impinging thereon.

18. A method of manufacturing a current sensor arrangement, the method comprising:
providing a conductor that is configured to conduct a primary current, the conductor comprising a first end and a second end oppositely arranged with respect to the first end with respect to a current flow direction of the primary current;
forming a current impeding structure across the conductor in a bisecting manner in a first direction that is orthogonal to the current flow direction;
forming a slit in the conductor that extends partially between the first end and the second end in the current flow direction, wherein the slit extends through the current impeding structure in the current flow direction and through the conductor in a second direction that is orthogonal to the current flow direction, wherein the slit divides the conductor into a first conductor portion and a second conductor portion both conjoined at the first end and the second end of the conductor;
deforming the first conductor portion and the second conductor portion in opposite directions with respect to second direction, thereby defining a gap; and
inserting a magnetic sensor through the gap such that the first conductor portion is arranged over a first portion of the magnetic sensor and the second conductor portion is arranged under a second portion of the magnetic sensor.

19. The method of manufacturing of claim 18, wherein the slit divides the current impeding structure into a first current impeding structure arranged at the first conductor portion and a second current impeding structure arranged at the second conductor portion.

20. The method of manufacturing of claim 19, further comprising:
electrically connecting a measurement circuit across the first current impeding structure or the second current impeding structure, wherein the measurement circuit is configured to measure a voltage drop across the first current impeding structure or the second current impeding structure.

21. The method of manufacturing of claim 19, further comprising:
electrically connecting a processing circuit to the magnetic sensor, the processing circuit configured to receive sensor signals generated by the magnetic sensor in response to measuring a first magnetic field produced by a first current flowing through the first current impeding structure and in response to measuring a second magnetic field produced by a second current flowing through the second current impeding structure.

22. A current sensor arrangement, comprising:
a first conductor configured to conduct a first portion of a primary current along a first current path in a current flow direction;
a second conductor configured to conduct a second portion of the primary current along a second current path in the current flow direction, wherein the first conductor and the second conductor are coupled in parallel,
wherein the first current produces a first magnetic field as it flows through the first conductor and the second current produces a second magnetic field as it flows through the second conductor, and
wherein the first conductor and the second conductor are separated from each other in a first direction that is orthogonal to the current flow direction, thereby defining a gap;
a magnetic sensor arranged in the gap such that the first conductor is arranged over a first portion of the magnetic sensor and the second conductor is arranged under a second portion of the magnetic sensor,
wherein the magnetic sensor is configured to generate a first sensor signal based on the first magnetic field impinging the first portion of the magnetic sensor and generate a second sensor signal based on the second magnetic field impinging the second portion of the magnetic sensor;
a measurement circuit configured to measure a voltage drop across a portion of the first conductor in the current flow direction; and a processing circuit configured to calculate a current value of the first current based on the measured voltage drop, generate a differential sensor signal based on the first sensor signal and the second sensor signal, and monitor for a fault condition based on the current value and the differential sensor signal.

23. The current sensor arrangement of claim 22, wherein: the magnetic sensor includes at least one first sensing element arranged in the first portion of the magnetic sensor and within the first magnetic field, the at least one first sensing element configured to generate the first sensor signal based on the first magnetic field impinging thereon, and
the magnetic sensor includes at least one second sensing element arranged in the second portion of the magnetic sensor and within the second magnetic field, the at least one second sensing element configured to generate the second sensor signal based on the second magnetic field impinging thereon.

24. The current sensor arrangement of claim 22, wherein: the processing circuit is further configured to calculate a difference between the current value and a value of the differential sensor signal, compare the calculated difference to a threshold value, and generate a fault signal on a condition that the calculated difference exceeds the threshold value.

25. The current sensor arrangement of claim 22, wherein: the first conductor includes a shunt that bisects the first conductor in a second direction that is orthogonal to the current flow direction, wherein the shunt produces the voltage drop.

26. The current sensor arrangement of claim 22, wherein the magnetic sensor is a unitary semiconductor chip.

27. The current sensor arrangement of claim 22, wherein the measurement circuit includes a first electrical contact to the first conductor and a second electrical contact to the first conductor for measuring the voltage drop.

28. The current sensor arrangement of claim 27, wherein the measurement circuit is a non-magnetic field measurement circuit.

29. The current sensor arrangement of claim 25, wherein: the shunt bisects an entire width of the first conductor in the second direction.

* * * * *